United States Patent
Park et al.

(10) Patent No.: US 11,227,860 B2
(45) Date of Patent: *Jan. 18, 2022

(54) MEMORY DEVICE

(71) Applicant: SAMSUNG ELECTRONICS CO., LTD., Suwon-si (KR)

(72) Inventors: Jooyong Park, Hwaseong-si (KR); Chanho Kim, Seoul (KR); Daeseok Byeon, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/942,854

(22) Filed: Jul. 30, 2020

(65) Prior Publication Data

US 2021/0066280 A1    Mar. 4, 2021

Related U.S. Application Data

(63) Continuation-in-part of application No. 16/816,476, filed on Mar. 12, 2020.

(30) Foreign Application Priority Data

Sep. 2, 2019    (KR) .................. 10-2019-0108359

(51) Int. Cl.
*H01L 23/522* (2006.01)
*H01L 25/18* (2006.01)
(Continued)

(52) U.S. Cl.
CPC .............. *H01L 25/18* (2013.01); *H01L 24/05* (2013.01); *H01L 24/08* (2013.01);
(Continued)

(58) Field of Classification Search
CPC ............................................ H01L 2224/80894
(Continued)

(56) References Cited

U.S. PATENT DOCUMENTS 9,299,736 B2    3/2016  Chen et al.
9,679,849 B1 *  6/2017  Chen ................ H01L 27/11582
(Continued)

OTHER PUBLICATIONS

Office Action dated Feb. 17, 2021 by the United States Patent and Trademark Office in counterpart U.S. Appl. No. 16/816,476.

*Primary Examiner* — Min Huang
(74) *Attorney, Agent, or Firm* — Sughrue Mion, PLLC

(57) ABSTRACT

A memory device includes a memory cell chip, a peripheral circuit chip, and a routing wire. The memory cell chip includes a memory cell array disposed on a first substrate, and a first metal pad on a first uppermost metal layer. The peripheral circuit chip includes circuit devices disposed on a second substrate, and a second metal pad on a second uppermost metal layer of the peripheral circuit chip. The memory cell chip and the peripheral circuit chip are vertically connected to each other by the first metal pad and the second metal pad in a bonding area. The routing wire is electrically connected to the peripheral circuit and is disposed in the first uppermost metal layer or the second uppermost metal layer and is disposed in a non-bonding area in which the memory cell chip and the peripheral circuit chip are not electrically connected to each other.

20 Claims, 12 Drawing Sheets

(51) Int. Cl.
*H01L 25/065* (2006.01)
*H01L 23/00* (2006.01)

(52) U.S. Cl.
CPC .............................. *H01L 25/0657* (2013.01); *H01L 2224/05147* (2013.01); *H01L 2224/08145* (2013.01); *H01L 2924/1431* (2013.01); *H01L 2924/14511* (2013.01)

(58) Field of Classification Search
USPC .................................................. 257/E21.511
See application file for complete search history.

(56) References Cited

U.S. PATENT DOCUMENTS

| | | |
|---|---|---|
| 10,050,018 B2* | 8/2018 | Wu ........................ H01L 24/02 |
| 10,074,667 B1* | 9/2018 | Higashi ............. H01L 27/11553 |
| 10,297,578 B2 | 5/2019 | Tagami et al. |
| 10,319,730 B2 | 6/2019 | Matsuo |
| 2005/0127534 A1 | 6/2005 | Stecher et al. |
| 2014/0367757 A1 | 12/2014 | Jakushokas et al. |
| 2016/0079164 A1 | 3/2016 | Fukuzumi et al. |
| 2019/0043868 A1 | 2/2019 | Hasnat et al. |
| 2019/0081069 A1 | 3/2019 | Lu et al. |
| 2021/0065751 A1* | 3/2021 | Park ........................ G11C 5/04 |

* cited by examiner

MEMORY DEVICE

CROSS-REFERENCE TO RELATED APPLICATION(S)

This application is a continuation-in-part of application Ser. No. 16/816,476, filed on Mar. 12, 2020, which claims priority from Korean Patent Application No. 10-2019-0108359 filed on Sep. 2, 2019 in the Korean Intellectual Property Office, the entire contents of each of which are incorporated by reference herein in their entireties.

BACKGROUND

1. Field

The present disclosure relates to a memory device.

2. Description of Related Art

Memory devices may provide the function of recording and erasing data or reading recorded data. Memory devices may be classified as a nonvolatile memory device or a volatile memory device. In a nonvolatile memory device, recorded data may be maintained even when power is cut thereto. The data storage capacity required for a memory device is continuously increasing, and various methods for improving the integration of a memory device have been proposed.

SUMMARY

It is an aspect to provide a memory device having an improved degree of integration by reducing a chip size.

According to an aspect of one or more embodiments, there is provided a memory device comprising a memory cell chip including a memory cell array disposed on a first substrate, and a first metal pad on a first uppermost metal layer of a memory cell region; and a peripheral circuit chip including circuit devices disposed on a second substrate, and a second metal pad on a second uppermost metal layer of the peripheral circuit chip, the circuit devices providing a peripheral circuit operating the memory cell array, wherein the memory cell chip and the peripheral circuit chip are vertically connected to each other by the first metal pad and the second metal pad in a bonding area, and a routing wire electrically connected to the peripheral circuit is disposed in at least one of the first uppermost metal layer or the second uppermost metal layer and is disposed in a non-bonding area in which the memory cell chip and the peripheral circuit chip are not electrically connected to each other.

According to an aspect of one or more embodiments, there is provided a memory device comprising a memory cell chip including a first bonding area and a first non-bonding area disposed around the first bonding area; and a peripheral circuit chip including a second bonding area disposed in a position corresponding to a position of the first bonding area, and a second non-bonding area disposed in a position corresponding to a position of the first non-bonding area and disposed around the second bonding area, wherein a first metal pad disposed on an uppermost metal layer of the first bonding area and a second metal pad disposed on an uppermost metal layer of the second bonding area are electrically connected to each other, wherein a third metal pad disposed in an uppermost metal layer of the first non-bonding area and a forth metal pad disposed on an uppermost metal layer of the second non-bonding area are not electrically connected to each other.

According to an aspect of one or more embodiments, there is provided a memory device comprising a memory cell chip including a first metal pad of a first bonding area and a third metal pad of a first non-bonding area; and a peripheral circuit chip including a second metal pad of a second bonding area and vertically connected to the memory cell chip by the first metal pad and the second metal pad and a fourth metal pad of a second non-bonding area, wherein the third metal pad is used as a first routing wire of the memory cell chip, the fourth metal pad is used as a second routing wire of the peripheral circuit chip.

BRIEF DESCRIPTION OF DRAWINGS

The above and other aspects will be more clearly understood from the following detailed description, taken in conjunction with the accompanying drawings, in which.

DETAILED DESCRIPTION

Hereinafter, example embodiments will be described with reference to the accompanying drawings. In this specification, the phrase "at least one of A or B" includes "only A", "only B" and "both A and B".

Figure 1:
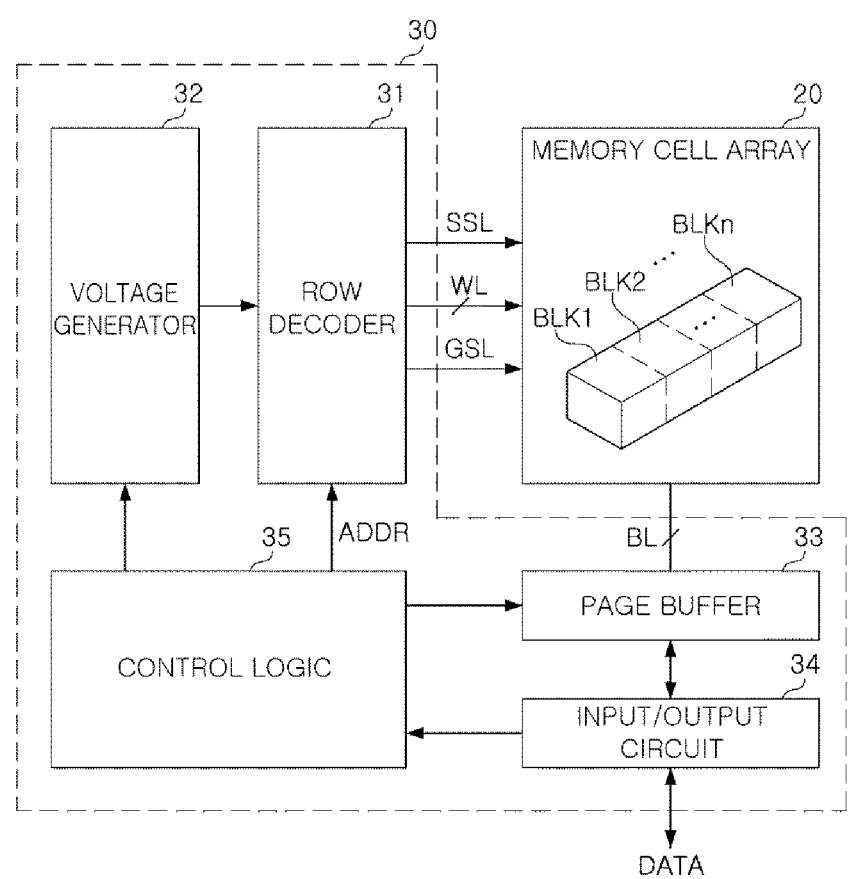
FIG. 1 is a block diagram schematically illustrating a memory device according to an example embodiment.

FIG. 1 is a block diagram schematically illustrating a memory device according to an example embodiment.

Referring first to FIG. 1, a memory device 10 may include a memory cell array 20 and a peripheral circuit 30. The peripheral circuit 30 may include a row decoder 31, a voltage generator 32, a page buffer 33, an input/output circuit 34, a control logic 35, and the like.

The memory cell array 20 may include a plurality of memory cells and may be divided into a plurality of blocks BLK1 to BLKn. The plurality of memory cells may be connected to the row decoder 31 by a string select line SSL, word lines WL, and a ground select line GSL, and the plurality of memory cells may be connected to the page buffer 33 by bit lines BL. In an example, in each of the blocks BLK1 to BLKn, a plurality of memory cells arranged at the same height from a substrate are connected to the same word line WL, and a plurality of memory cells disposed on the same position on a plane parallel to an upper surface of the substrate may provide memory cell strings sharing one channel region. In addition, portions of the memory cell strings included in each of the blocks BLK1 to BLKn may be connected to the same bit line BL.

The row decoder 31 may generate and transmit voltages for driving the word lines WL by decoding address data ADDR received from the control logic 35 or the like. The row decoder 31 may input a word line voltage generated by the voltage generator 32 to the word lines WL under the control of the control logic 35. For example, the row decoder 31 may be connected to the word lines WL by pass transistors, and may input the word line voltage to the word lines WL when the pass transistors are turned on.

The page buffer 33 may be connected to the memory cell array 20 by the bit lines BL, and may read data stored in the memory cells or write data to the memory cells. The page buffer 33 may include a column decoder and a sense amplifier. The column decoder may select at least a portion of the bit lines BL of the memory cell array 20, and the sense amplifier may read data of a memory cell connected to the bit line BL selected by the column decoder during a reading operation.

The input/output circuit 34 may receive data (DATA) and transfer the data to the page buffer 33 during a programming operation, and may externally output data read from the memory cell array 20 by the page buffer 33 during a reading operation. The input/output circuit 34 may transfer an address or command input from an external memory controller to the control logic 35.

The control logic 35 may control operations of the row decoder 31, the voltage generator 32, the page buffer 33, and the like. In an example embodiment, the control logic 35 may operate by a control signal and an external voltage transmitted from an external memory controller or the like.

The voltage generator 32 may generate control voltages required for the operation of the memory device 10, for example, a programming voltage, a reading voltage, an erasing voltage, a pass voltage and the like, using an externally input power voltage. The voltage generated by the voltage generator 32 may be supplied to the peripheral circuit 30 or may be input to the memory cell array 20 by the row decoder 31 or the like.

For example, a programming voltage may be input to a selected word line connected to a selected memory cell to which data is to be written in a programming operation. A pass voltage lower than a programming voltage may be input to unselected word lines that are connected to unselected memory cells included in one memory cell string with a selected memory cell and that share a channel region with the selected memory cell. The programming operation may be executed in the unit of a page.

In an example embodiment, in a reading operation, a reading voltage is input to a selected word line connected to a selected memory cell to read data, and the pass voltage may be input to the unselected word lines connected to unselected memory cells sharing the channel region with the selected memory cell. In an example embodiment in which each of the memory cells stores data having a plurality of bits, the row decoder 31 may input a plurality of reading voltages having different magnitudes to the selected word line. The reading operation may be executed in the unit of a page.

Figure 2:
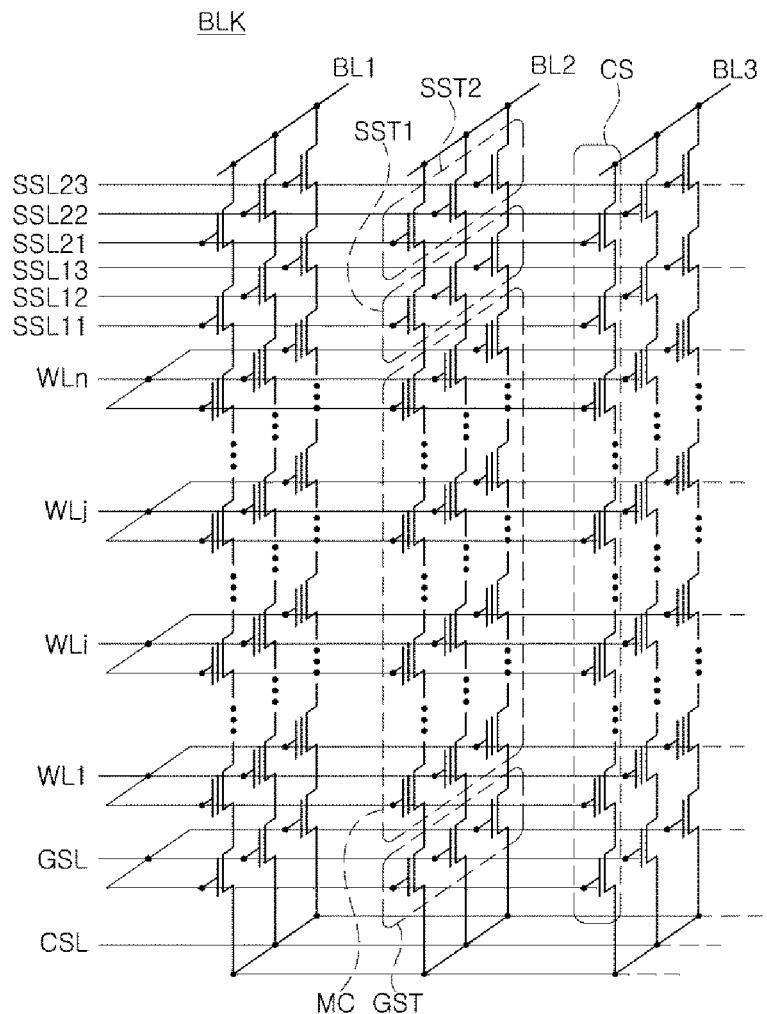
FIG. 2 is a circuit diagram schematically illustrating a memory device according to an example embodiment.

FIG. 2 is a circuit diagram schematically illustrating a memory device according to an example embodiment.

Referring to FIG. 2, one memory block BLK may include a plurality of memory cell strings CS, and at least portions of the memory cell strings CS may share word lines WL1 to WLn and/or bit lines BL1 to BL3.

Each of the memory cell strings CS may include a plurality of memory cells MC connected between a first string select transistor SST1 and a second string select transistor SST2 and a ground select transistor GST. In the example illustrated in FIG. 2, four memory cells MC are shown. However, this is only an example, and in other embodiments, the number may be more or less than four. The first and second string select transistors SST1 and SST2 are connected to each other in series, and the second string select transistor SST2 disposed on the first string select transistor SST1 may be connected to one of the bit lines BL1 to BL3. The ground select transistor GST may be connected to a common source line CSL. Memory cells MC included in each of the memory cell strings CS may share one channel region.

The plurality of memory cells MC may be connected in series between the first and second string select transistors SST1 and SST2 and the ground select transistor GST. According to example embodiments, the number of the string select transistors SST1 and SST2 and the ground select transistors GST may be variously modified, and each of the memory cell strings CS may further include at least one dummy memory cell. For example, the dummy memory cells may be connected between the first string select transistor SST1 and the memory cells MC, and/or between the ground select transistor GST and the memory cells MC.

Gate electrodes of the memory cells MC may be connected to the word lines WL1 to WLn. A gate electrode of the ground select transistor GST may be connected to the ground select line GSL, and gate electrodes of the first and second string select transistors SST1 and SST2 may be connected to string select lines SSL11 to SSL23.

The ground select line GSL, the word lines WL1 to WLn, and the string select lines SSL11 to SSL23 may be stacked in a first direction perpendicular to an upper surface of the substrate. The ground select line GSL, the word lines WL1 to WLn, and the string select lines SSL11 to SSL23 may be penetrated by a channel structure including a channel region. The channel structure may be connected to one of the bit lines BL1 to BL3.

To increase the degree of integration of the memory device, it is advantageous to efficiently secure a space for a signal line for transmitting signals or a power line for supplying power.

According to an example embodiment, routing wires may be formed in an uppermost metal layer of a non-bonding area in which a cell region and a peripheral circuit region are not electrically connected. Therefore, since there is no need to secure a separate space for a separate routing wire, the chip size may be reduced.

Figure 3:
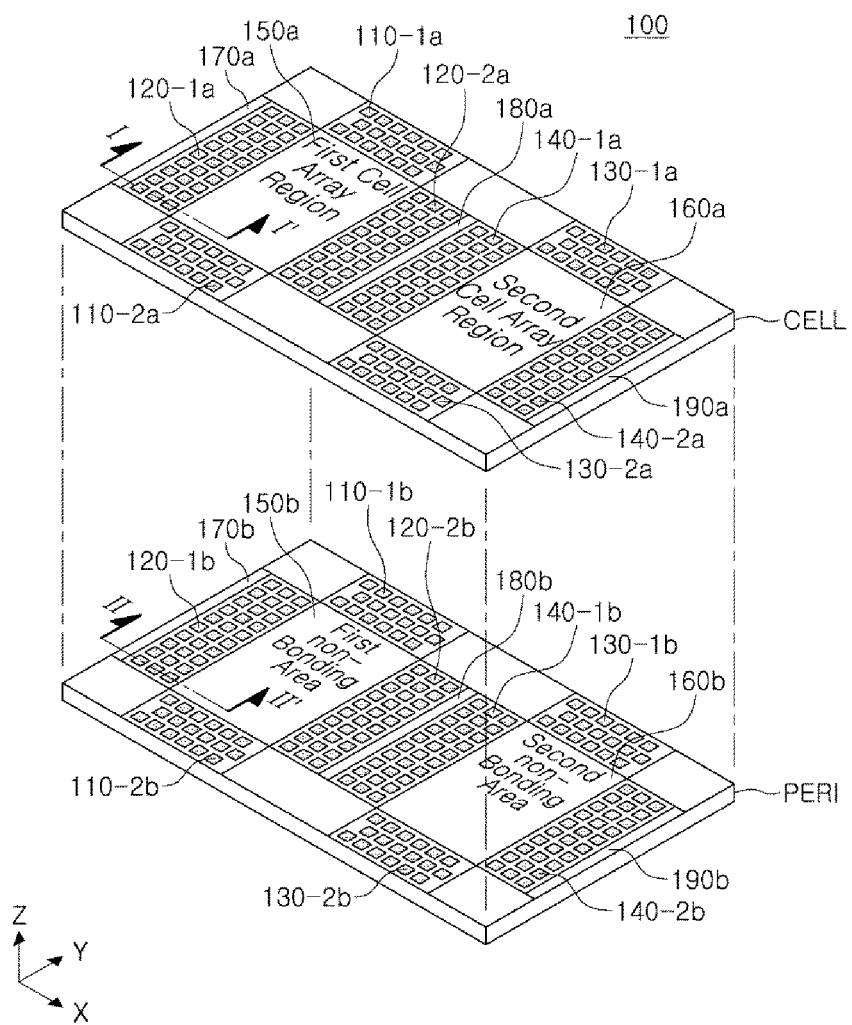
FIG. 3 is a schematic plan view illustrating a memory device according to an example embodiment.

FIG. 3 is a schematic plan view illustrating a memory device according to an example embodiment.

Referring to FIG. 3, a memory device 100 may include a peripheral circuit region PERI and a cell region CELL disposed on the peripheral circuit region PERI. The peripheral circuit region PERI and the cell region CELL may be stacked in a vertical direction (i.e., in a Z direction illustrated in FIG. 3). The peripheral circuit region PERI may constitute the peripheral circuit 30 of FIG. 1. The cell region CELL may constitute the memory cell array 20 of FIG. 1. The peripheral circuit region PERI may include a row decoder, a page buffer, and other peripheral circuits. The cell region CELL may include memory cell arrays.

In the peripheral circuit region PERI, the row decoder may correspond to the row decoder 31 described above with reference to FIG. 1, and the page buffer may correspond to the page buffer 33 described above with reference to FIG. 1. In some embodiments, the other peripheral circuits may be the control logic 35 and the voltage generator 32 of FIG. 1, and for example, in some embodiments, the other peripheral circuits may include a latch circuit, a cache circuit, or a sense amplifier. In addition, in some embodiments, the other peripheral circuits may include the input/output circuit 34 of FIG. 1 and may include an electrostatic discharge (ESD) device or a data input/output circuit. In example embodiments, the input/output circuit 34 may be disposed to form a separate area around the other peripheral circuit.

In the peripheral circuit region PERI, at least a portion of the row decoder, the page buffer and other peripheral circuits may be disposed below the memory cell arrays of the cell region CELL. For example, the page buffer may be disposed below the memory cell arrays to overlap the memory cell arrays. However, in some embodiments, circuits included in the peripheral circuit region PERI and arrangements thereof may be variously changed, and thus, circuits disposed overlapping the memory cell arrays may be variously changed.

In the cell region CELL, the memory cell arrays may be disposed in parallel to be spaced apart from each other. According to various embodiments, the number and arrangement of memory cell arrays disposed in the cell region CELL may be changed variously. For example, the memory cell arrays in this embodiment may have a form disposed repeatedly in succession.

The memory device 100 may have a chip to chip (C2C) structure. The C2C structure may be a structure in which an upper semiconductor chip, including a cell region CELL, is fabricated on a first wafer, a lower semiconductor chip, including a peripheral circuit region PERI, is fabricated on a second wafer, different from the first wafer, and then, the upper semiconductor chip and the lower semiconductor chip are connected to each other by a bonding method. For example, the bonding method may refer to a method of electrically connecting a bonding metal formed in an uppermost metal layer of the upper semiconductor chip and a bonding metal formed in an uppermost metal layer of the lower semiconductor chip to each other. For example, when the bonding metal is formed of copper (Cu), the bonding method may be a Cu—Cu bonding method.

In an example embodiment, the upper semiconductor chip and the lower semiconductor chip may be stacked on each other at a wafer level. According to another embodiment, the upper semiconductor chip and the lower semiconductor chip may be stacked on each other at a chip level.

Each of the upper semiconductor chip and the lower semiconductor chip may include a bonding area and a non-bonding area except for the bonding area. That is, in some embodiments, the non-bonding area may be any area of the chip other than the bonding area. To electrically connect the upper semiconductor chip and the lower semiconductor chip to each other, a bonding metal formed in the uppermost metal layer of the upper semiconductor chip and a bonding metal formed in the uppermost metal layer of the lower semiconductor chip may be electrically connected to each other in the bonding area. The bonding metal may be used for connection of word line, bit line, and well bias.

The cell region CELL may include first bit line connection pads 110-1a and 110-2a, first word line connection pads 120-1a and 120-2a, a first cell array region 150a, second bit line connection pads 130-1a and 130-2a, second word line connection pads 140-1a and 140-2a, a second cell array region 160a, and non-bonding areas 170a, 180a and 190a. The peripheral circuit region PERI may include first bit line connection pads 110-1b and 110-2b, first word line connection pads 120-1b and 120-2b, a first non-bonding area 150b, second bit line connection pads 130-1b and 130-2b, second word line connection pads 140-1b and 140-2b, a second non-bonding area 160b, and third non-bonding areas 170b, 180b and 190b.

The bit line connection pads 110-1a, 110-2a, 130-1a and 130-2a and the word line connection pads 120-1a, 120-2a, 140-1a and 140-2a in the cell region CELL may be a region including a wiring structure penetrating through the cell region CELL and connected to the peripheral circuit region PERI. The bit line connection pads 110-1a, 110-2a, 130-1a and 130-2a and the word line connection pads 120-1a, 120-2a, 140-1a and 140-2a may be disposed on at least one side of each of the first and second cell array regions 150a and 160a, and for example, may include a wiring structure such as a contact plug electrically connected to the row decoder of the peripheral circuit region PERI. In addition, a through-wiring structure may also be disposed in the first and second cell array regions 150a and 160a, and for example, regions including the wiring structure electrically connected to a page buffer of the peripheral circuit region PERI may be included in the first and second cell array regions 150a and 160a.

The first bit line connection pads 110-1a and 110-2a of the cell region CELL may be electrically connected to the first bit line connection pads 110-1b and 110-2b of the peripheral circuit region PERI by a bonding method, respectively. Accordingly, the first bit line connection pads 110-1a and 110-2a of the cell region CELL and the first bit line connection pads 110-1b and 110-2b of the peripheral circuit region PERI may be included in a bonding area.

The first word line connection pads 120-1a and 120-2a of the cell region CELL may be electrically connected to the first word line connection pads 120-1b and 120-2b of the peripheral circuit region PERI by a bonding method, respectively. Accordingly, the first word line connection pads 120-1a and 120-2a of the cell region CELL and the first word line connection pads 120-1b and 120-2b of the peripheral circuit region PERI may be included in the bonding area.

The second bit line connection pads 130-1a and 130-2a of the cell region CELL may be electrically connected to the second bit line connection pads 130-1b and 130-2b of the peripheral circuit region PERI by a bonding method, respectively. Accordingly, the second bit line connection pads 130-1a and 130-2a of the cell region CELL and the second bit line connection pads 130-1b and 130-2b of the peripheral circuit region PERI may be included in the bonding area.

The second word line connection pads 140-1a and 140-2a of the cell region CELL may be electrically connected to the second word line connection pads 140-1b and 140-2b of the peripheral circuit region PERI by a bonding method, respectively. Accordingly, the second word line connection pads 140-1a and 140-2a of the cell region CELL and the second word line connection pads 140-1b and 140-2b of the peripheral circuit region PERI may be included in the bonding area.

The first and second cell array regions 150a and 160a of the cell region CELL, and the first and second non-bonding areas 150b and 160b of the peripheral circuit region PERI corresponding respectively to the first and second cell array regions 150a and 160a of the cell region CELL, may be included in a non-bonding area. In other words, the first and second cell array regions 150a and 160a of the cell region CELL are not bonded. The non-bonding areas 170a, 180a and 190a of the cell region CELL, and non-bonding areas 170b, 180b and 190b of the peripheral circuit region PERI corresponding respectively to the non-bonding areas 170a, 180a and 190a of the cell region CELL may be included in the non-bonding area.

The memory device 100 may be configured, in such a manner that the bonding areas 110-1a, 110-2a, 120-1a and 120-2a are disposed to surround the first non-bonding area 150a, and similarly, the bonding areas 130-1a, 130-2a, 140-1a and 140-2a may be disposed to surround the second non-bonding area 160a.

In addition, the memory device 100 may be configured in such a manner that the bonding areas 110-1b, 110-2b, 120-1b and 120-2b surround the first non-bonding area 150b, and similarly, the bonding areas 130-1b, 130-2b, 140-1b and 140-2b surround the second non-bonding area 160b.

In the non-bonding areas 150a, 160a, 170a, 180a, 190a, 150b, 160b, 170b, 180b and 190b, a metal pattern of an uppermost metal layer may be present as a dummy pattern, or the uppermost metal layer may be empty.

According to an example embodiment, the uppermost metal layer of the non-bonding area provided as the dummy pattern or the empty space may be used as a signal line or a power line to reduce the chip size. The signal line may be wiring for transmitting a signal, and the power line may be wiring for supplying power. The chip size may be reduced by utilizing the uppermost metal layer of the non-bonding area as routing wires, and thus, the degree of integration of the memory device 100 may be increased.

FIGS. 4A to 4D are schematic plan views of memory devices according to example embodiments.

Figure 4A:
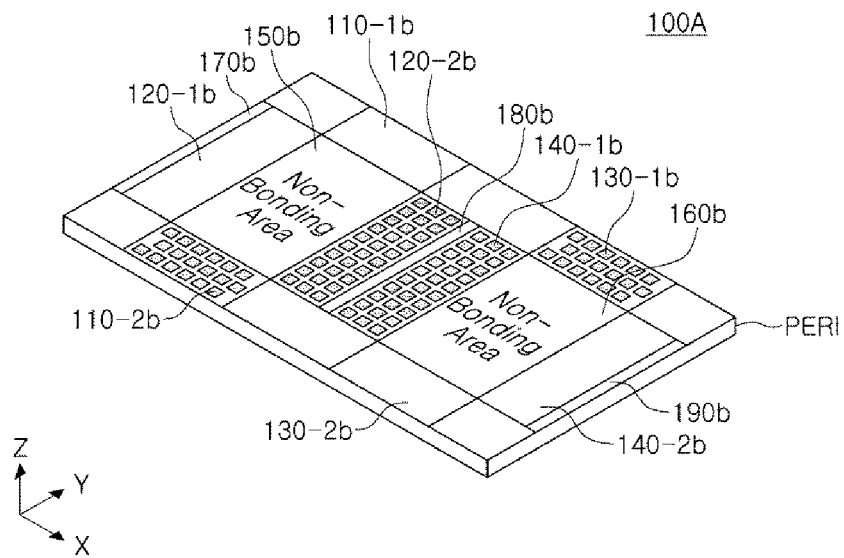
FIGS. 4A to 4D are schematic plan views illustrating a memory device according to example embodiments.

Referring to FIG. 4A, each of a first non-bonding area 150b and a second non-bonding area 160b in a peripheral circuit region PERI may include a first side, a second side parallel to and opposing the first side, and a third side and a fourth side parallel to and opposing each other between the first side and the second side.

In a memory device 100A, bonding areas 110-2b and 120-2b may be disposed to surround the second and fourth sides of the first non-bonding area 150b in the peripheral circuit region PERI. In addition, in the memory device 100A, bonding areas 130-1b and 140-1b may be disposed to surround the first and third sides of the second non-bonding area 160b. In FIG. 4A, non-bonding areas 110-1b and 120-1b may be disposed to surround the first and third sides of the first non-bonding area 150b, and non-bonding areas 130-2b and 140-2b may be disposed to surround the second and fourth sides of the second non-bonding area 160b.

Figure 4B:
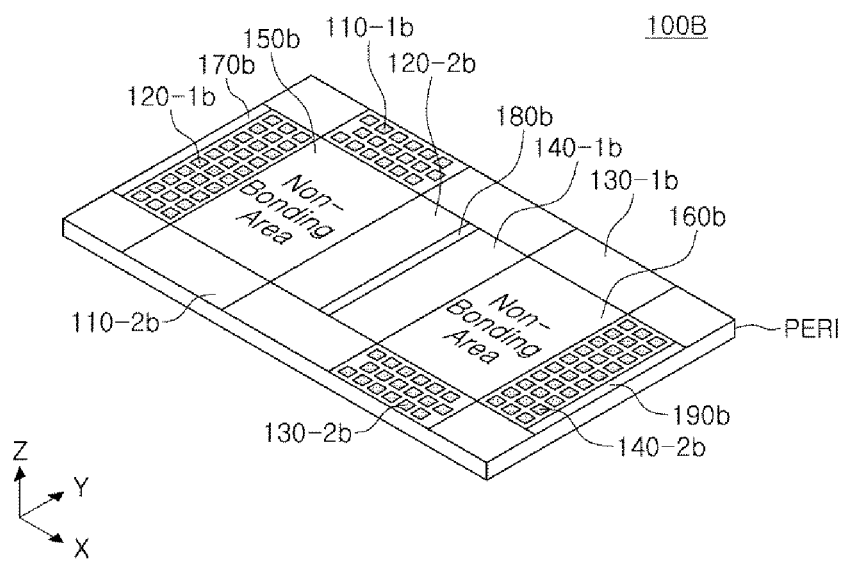

Referring to FIG. 4B, unlike the memory device 100A of FIG. 4A, in the case of a memory device 100B of FIG. 4B, bonding areas 110-1b and 120-1b may be disposed to surround first and third sides of a first non-bonding area 150b in a peripheral circuit region PERI. In addition, in the memory device 100B, bonding areas 130-2b and 140-2b may be disposed to surround second and fourth sides of a second non-bonding area 160b. In FIG. 4B, non-bonding areas 110-2b and 120-2b may be disposed to surround second and fourth sides of the first non-bonding area 150b, and non-bonding areas 130-1b and 140-1b may be disposed to surround first and third sides of the second non-bonding area 160b.

Figure 4C:
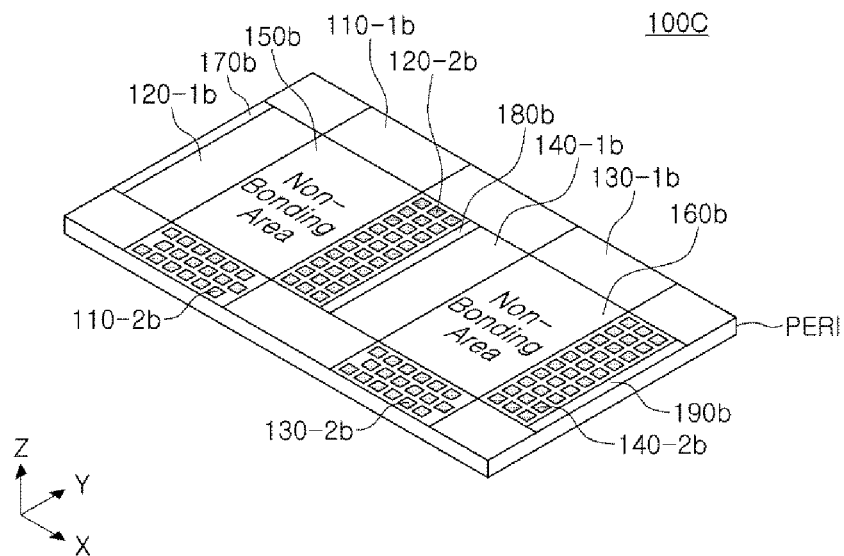

Referring to FIG. 4C, unlike the memory device 100A of FIG. 4A, in the case of a memory device 100C of FIG. 4C, bonding areas 110-2b and 120-2b may be disposed to surround second and fourth sides of the first non-bonding area 150b in the peripheral circuit region PERI. In addition, in the memory device 100C, bonding areas 130-2b and 140-2b may be disposed to surround the second and fourth sides of the second non-bonding area 160b. In FIG. 4C, non-bonding areas 110-1b and 120-1b may be disposed to surround first and third sides of the first non-bonding area 150b, and non-bonding areas 130-1b and 140-1b may be disposed to surround the first and third sides of the second non-bonding area 160b.

Figure 4D:
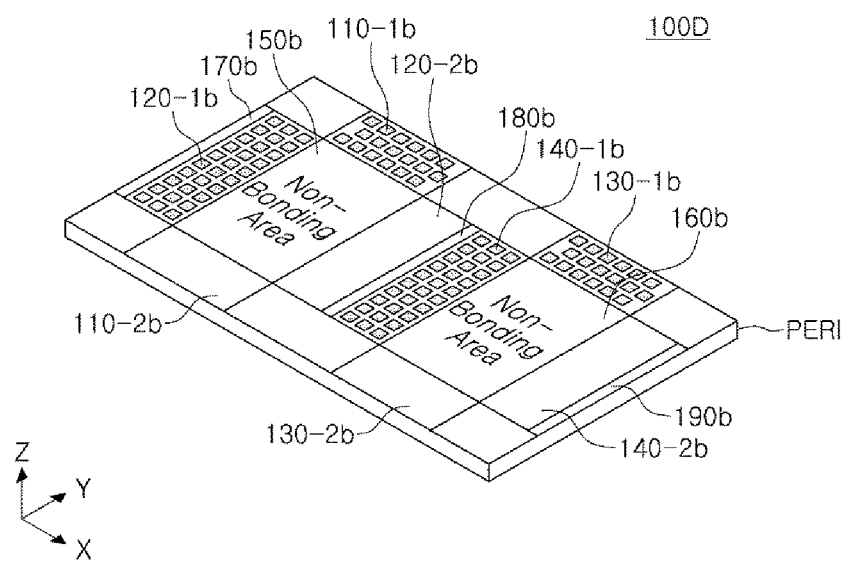

Referring to FIG. 4D, unlike the memory device 100A of FIG. 4A, in the case of a memory device 100D of FIG. 4D, bonding areas 110-1b and 120-1b may be disposed to surround the first and third sides of the first non-bonding area 150b in the peripheral circuit region PERI. In addition, in the memory device 100D, bonding areas 130-1b and 140-1b may be disposed to surround the first and third sides of the second non-bonding area 160b. In FIG. 4D, non-bonding areas 110-2b and 120-2d may be disposed to surround the second and fourth sides of the first non-bonding area 150b, and non-bonding areas 130-2b and 140-2b may be disposed to surround the second and fourth sides of the second non-bonding area 160b.

As described with reference to FIGS. 4A to 4D, the arrangement of the bonding area and the non-bonding area in the peripheral circuit region PERI may be variously changed. Similarly, the bonding area and the non-bonding area in the cell region CELL may also be changed variously.

Figure 5:
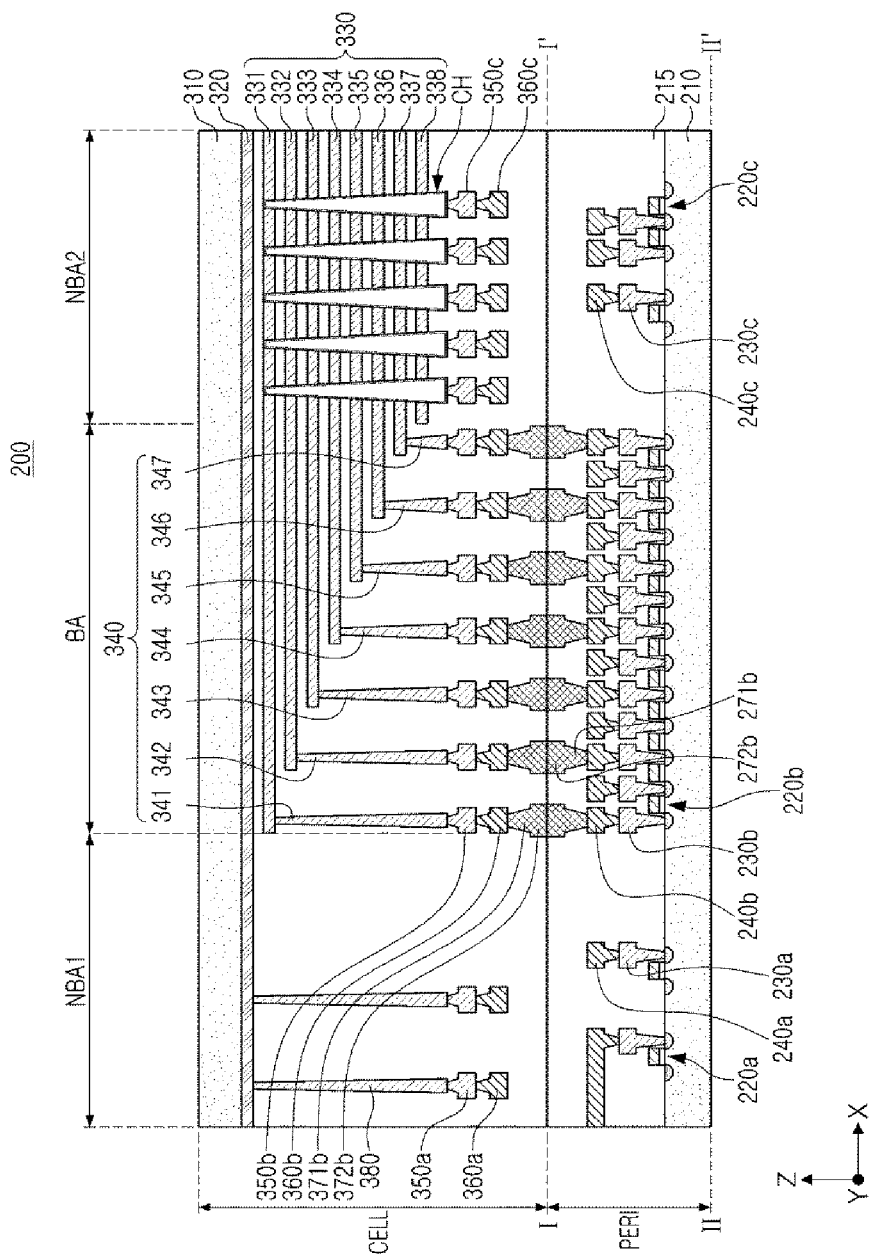
FIGS. 5 to 8 are cross-sectional views of the memory device illustrated in FIG. 3, taken along line I-I' and II-II'.

FIGS. 5 to 8 are cross-sectional views of a memory device illustrated in FIG. 3, taken along lines I-I' and First, referring to FIG. 5, a memory device 200 may include a peripheral circuit region PERI and a cell region CELL disposed on the peripheral circuit region PERI. Each of the peripheral circuit region PERI and the cell region CELL may include a first non-bonding area NBA1, a bonding area BA, and a second non-bonding area NBA2.

The peripheral circuit region PERI may include a first substrate 210, an interlayer insulating layer 215, a plurality of circuit devices 220a, 220b and 220c formed on the first substrate 210, first metal layers 230a, 230b and 230c connected to the plurality of circuit devices 20a, 220b and 220c, respectively, and second metal layers 240a, 240b and 240c formed on the first metal layers 230a, 230b and 230c, respectively. The first metal layers 230a, 230b and 230c may be formed of tungsten having relatively high resistance. The second metal layers 240a, 240b and 240c may be formed of copper having relatively low resistance.

In this specification, only the first metal layers 230a, 230b and 230c and the second metal layers 240a, 240b and 240c are illustrated and described, but example embodiments thereof are not limited thereto. For example, a third metal layer may be further formed on the second metal layers 240a, 240b and 240c. The third metal layer may be formed of aluminum that has lower resistance than that of copper forming the second metal layers 240a, 240b and 240c.

The interlayer insulating layer 215 may be disposed on the first substrate 210 to cover the plurality of circuit devices 220a, 220b and 220c, the first metal layers 230a, 230b and 230c, and the second metal layers 240a, 240b and 240c. The interlayer insulating layer 215 may include an insulating material such as silicon oxide, silicon nitride, or the like.

Lower bonding metals 271b and 272b may be formed on the second metal layer 240b of the bonding area BA. In the bonding area BA, the lower bonding metals 271b and 272b of the peripheral circuit region PERI may be electrically connected to upper bonding metals 371b and 372b of the cell region CELL by a Cu—Cu bonding method.

The cell region CELL may provide at least one memory block. The cell region CELL may include a second substrate 310 and a common source line 320.

On the second substrate 310, a plurality of word lines 331 to 338 (collectively, word lines 330) may be stacked in a third direction (Z direction) perpendicular to an upper surface of the second substrate 310. String select lines and a ground select line may be disposed on upper and lower portions of the word lines 330, respectively. The plurality of word lines 330 may be disposed between the string select lines and the ground select line.

In the second non-bonding area NBA2, a channel structure CH may extend in the third direction (Z direction) to penetrate through the word lines 330, the string select lines, and the ground select line. The channel structure CH may include a data storage layer, a channel layer, an embedded insulating layer, and the like, and the channel layer may be electrically connected to a second metal layer 360c by a first metal layer 350c. For example, the first metal layer 350c may be a bit line contact, and the second metal layer 360c may be a bit line. In an example embodiment, the bit line 360c may extend in a second direction (Y direction). An area in which the channel structure CH, the bit line 360c and the like are disposed may be defined as the second non-bonding area NBA2.

In the bonding area, the word lines 330 may extend in the first direction (X direction) and may be connected to a plurality of cell contact plugs 341 to 347 (collectively, contact plugs 340) in the bonding area BA. The word lines 330 and the cell contact plugs 340 may be connected to each other on pads. A first metal layer 350b and a second metal layer 360b may be sequentially stacked on the word lines 330. The word lines 330 may be connected to the peripheral circuit region PERI by upper bonding metals 371b and 372b of the cell region CELL and lower bonding metals 271b and 272b of the peripheral circuit region PERI in the bonding area BA.

In the first non-bonding area NBA1, a common source line contact plug 380 may be formed of a conductive material such as a metal, a metal compound, polysilicon or the like. The common source line contact plug 380 may be electrically connected to the common source line 320. A first metal layer 350a and a second metal layer 360a may be sequentially stacked on the common source line contact plug 380. An area in which the common source line contact plug 380, the first metal layer 350a, and the second metal layer 360a are disposed may be defined as the first non-bonding area NBA1.

In the respective first non-bonding area NBA1 and second non-bonding area NBA2 included in each of the cell region CELL and the peripheral circuit region PERI, a metal pattern of an uppermost metal layer may be present as a dummy pattern, or the uppermost metal layer may be empty.

According to an example embodiment, to reduce the chip size, the uppermost metal layer of the respective first non-bonding area NBA1 and second non-bonding area NBA2, provided as the dummy pattern or the empty space, may be used as a signal line or a power line. By this configuration, the chip size may be reduced by using the uppermost metal layers of the respective first non-bonding area NBA1 and second non-bonding area NBA2 as routing wires. Therefore, the degree of integration of the memory device 200 may be increased.

Figure 6:
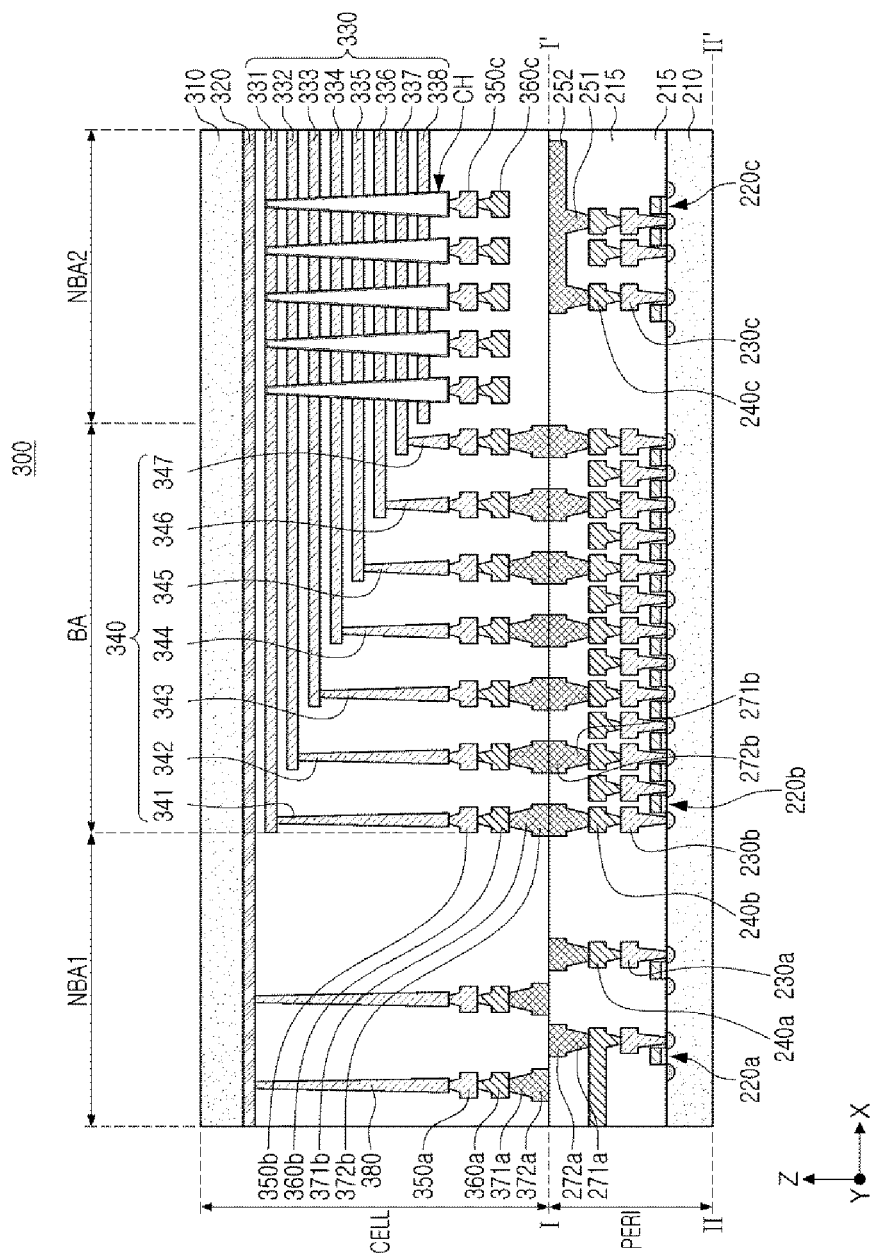

Referring to FIG. 6, in a memory device 300, routing wires may be formed in uppermost metal layers in respective first non-bonding area NBA1 and second non-bonding area NBA2 of a cell region CELL and a peripheral circuit region PERI. The routing wires may be a signal line or a power line. For example, the routing wires may be formed of copper.

As an example, in the first non-bonding area NBA1, the uppermost metal layer of the cell region CELL may be an empty space. In this case, upper bonding metals 371a and 372a may be formed in the uppermost metal layer of the cell region CELL. The upper bonding metals 371a and 372a formed in the uppermost metal layer of the cell region CELL may be used as routing wires.

For example, the upper bonding metals 371a and 372a formed in the uppermost metal layer of the cell region CELL may be disposed on the common source line contact plug 380. The upper bonding metals (371a and 372a) formed in the uppermost metal layer of the cell region CELL may include a contact 371a and an upper metal pattern 372a. The common source line contact plug 380 and the upper metal pattern 372a may be electrically connected to each other by the contact 371a.

According to an example embodiment, in the first non-bonding area NBA1, the uppermost metal layer of the cell region CELL may further include a dummy pattern.

In the first non-bonding area NBA1, an uppermost metal layer of the peripheral circuit region PERI may be an empty space. In this case, lower bonding metals 271a and 272a may be formed in the uppermost metal layer of the peripheral circuit region PERI. The lower bonding metals 271a and 272a formed in the uppermost metal layer of the peripheral circuit region PERI may be used as routing wires.

For example, in the first non-bonding area NBA1, the lower bonding metals 271a and 272a formed in the uppermost metal layer of the peripheral circuit region PERI may be disposed on the second metal layer 240a. The lower bonding metals 271a and 272a formed in the uppermost metal layer of the peripheral circuit region PERI may include a contact 271a and an upper metal pattern 272a. The second metal layer 240a and the upper metal pattern 272a may be electrically connected to each other by the contact 271a.

In some embodiments, in the first non-bonding area NBA1, the uppermost metal layer of the peripheral circuit region PERI may further include a dummy pattern.

In the second non-bonding area NBA2, the uppermost metal layer of the peripheral circuit region PERI may be an empty space. In this case, lower bonding metals 251 and 252 may be formed in the uppermost metal layer of the peripheral circuit region PERI. The lower bonding metals 251 and 252 formed in the uppermost metal layer of the peripheral circuit region PERI may be used as routing wires.

For example, in the second non-bonding area NBA2, the lower bonding metals 251 and 252 formed in the uppermost metal layer of the peripheral circuit region PERI may be disposed on the second metal layer 240c. The lower bonding metals (251 and 252) formed in the uppermost metal layer of the peripheral circuit region PERI may include a contact 251 and a lower metal pattern 252. The second metal layer 240c and the lower metal pattern 252 may be electrically connected to each other by the contact 251.

According to an example embodiment, in the second non-bonding area NBA2, the uppermost metal layer of the peripheral circuit region PERI may further include a dummy pattern.

The peripheral circuit region PERI may include a logic region and a core region. The core region may include a page buffer, a row decoder, and the like. The logic region may include a voltage generator, a control logic such as a timing controller for driving the core region, and the like. The logic region and the core region may be powered from one power source. Therefore, the power respectively supplied to the logic region and the core region may have the same level.

Signal lines or power lines may be formed in an uppermost metal layer of a non-bonding area. For example, when signal lines are formed in the uppermost metal layer of the non-bonding area, the signal lines may be word lines, bit lines, and signal lines of logic regions. In addition, when power lines are formed in the uppermost metal layer of the non-bonding area, the power lines may be power lines of a voltage of a common source region, a power supply voltage and a ground voltage of a logic region, and an external power supply voltage EVC.

According to an example embodiment, the chip size may be reduced by forming routing wires in the uppermost metal layer of the non-bonding area.

For example, when the power line is formed in the uppermost metal layer of the non-bonding area, the utilization of the power line may increase. Thus, the logic region and the core region may be respectively powered from different power sources. As a result, power respectively supplied to the logic region and the core region may have different levels. In addition, since each power source may be controlled independently, control loading of respective power sources may be reduced.

The uppermost metal layer of the non-bonding area may also be utilized as a power line supplying a predetermined level of voltage. For example, the predetermined level of voltage may be a power supply voltage, a ground voltage, or the like. A power line supplied with a predetermined level of voltage may be located between two signal lines. As a result, the power line may prevent crosstalk between two signal lines. Therefore, the power line formed in the uppermost metal layer of the non-bonding area may be used for signal shielding.

Figure 7:
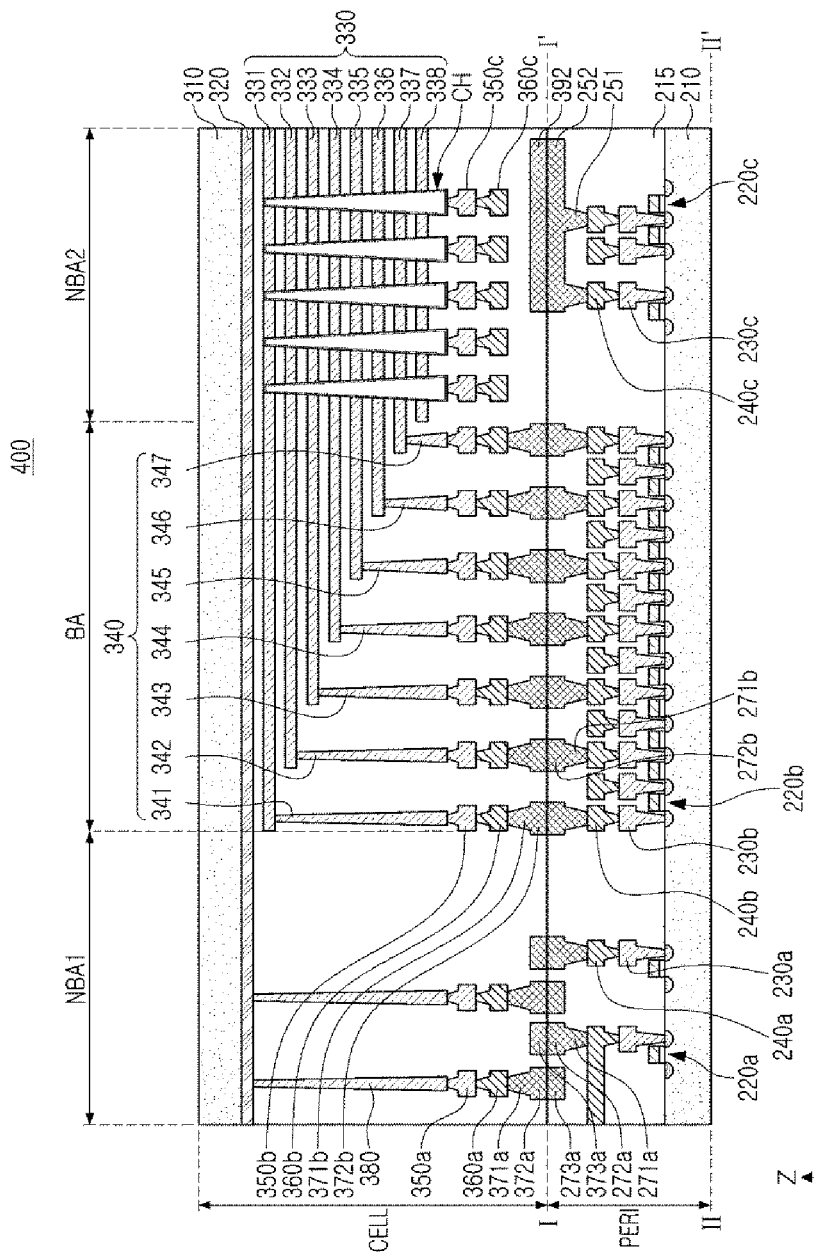

Referring to FIG. 7, in the case of a memory device 400, in a first non-bonding area NBA1, corresponding to the upper metal pattern 372a formed in the uppermost metal layer of the cell region CELL, a lower metal pattern 273a having the same shape as the upper metal pattern 372a of the cell region CELL may be formed in an uppermost metal layer of a peripheral circuit region PERI. A contact may not be formed on the lower metal pattern 273a formed in the uppermost metal layer of the peripheral circuit region PERI.

Similarly, in the first non-bonding area NBA1, corresponding to the lower metal pattern 272a formed in the uppermost metal layer of the peripheral circuit region PERI, an upper metal pattern 373a having the same shape as the lower metal pattern 272a of the peripheral circuit region PERI may be formed in an uppermost metal layer of a cell region CELL. A contact may not be formed on the upper metal pattern 373a formed in the uppermost metal layer of the cell region CELL.

In the second non-bonding area NBA2, corresponding to the lower metal pattern 252 formed in the uppermost metal layer of the peripheral circuit region PERI, an upper metal pattern 392 having the same shape as the lower metal pattern 252 of the peripheral circuit region PERI may be formed in an uppermost metal layer of the cell region CELL. A contact may not be formed on the upper metal pattern 392 formed in the uppermost metal layer of the cell region CELL.

According to an example embodiment, corresponding to a metal pattern formed in an uppermost metal layer of any one chip, a reinforcing metal pattern having the same shape as the metal pattern may also be formed in an uppermost metal layer of another chip. In this case, a contact may not be formed on the reinforcing metal pattern.

Therefore, the thickness of the metal pattern formed in any one chip may be increased. Since the thickness of the metal pattern is increased, the resistance of the metal pattern may be reduced. As a result, signal characteristics may be improved when the metal pattern formed in any one chip is used as the signal line. In addition, when a metal pattern formed in any one chip is used as a power line, power noise may be reduced.

The metal pattern formed in the uppermost metal layer of the peripheral circuit region PERI and the metal pattern formed in the uppermost metal layer of the cell region CELL may be formed on the same position. Thus, a mask for forming the metal pattern in the uppermost metal layer of the peripheral circuit region PERI and a mask for forming the metal pattern in the uppermost metal layer of the cell region CELL may be the same. Since the metal pattern of the uppermost metal layer of the peripheral circuit region PERI and the metal pattern of the uppermost metal layer of the cell region CELL may be formed using the same mask, the process cost may be reduced.

Figure 8:
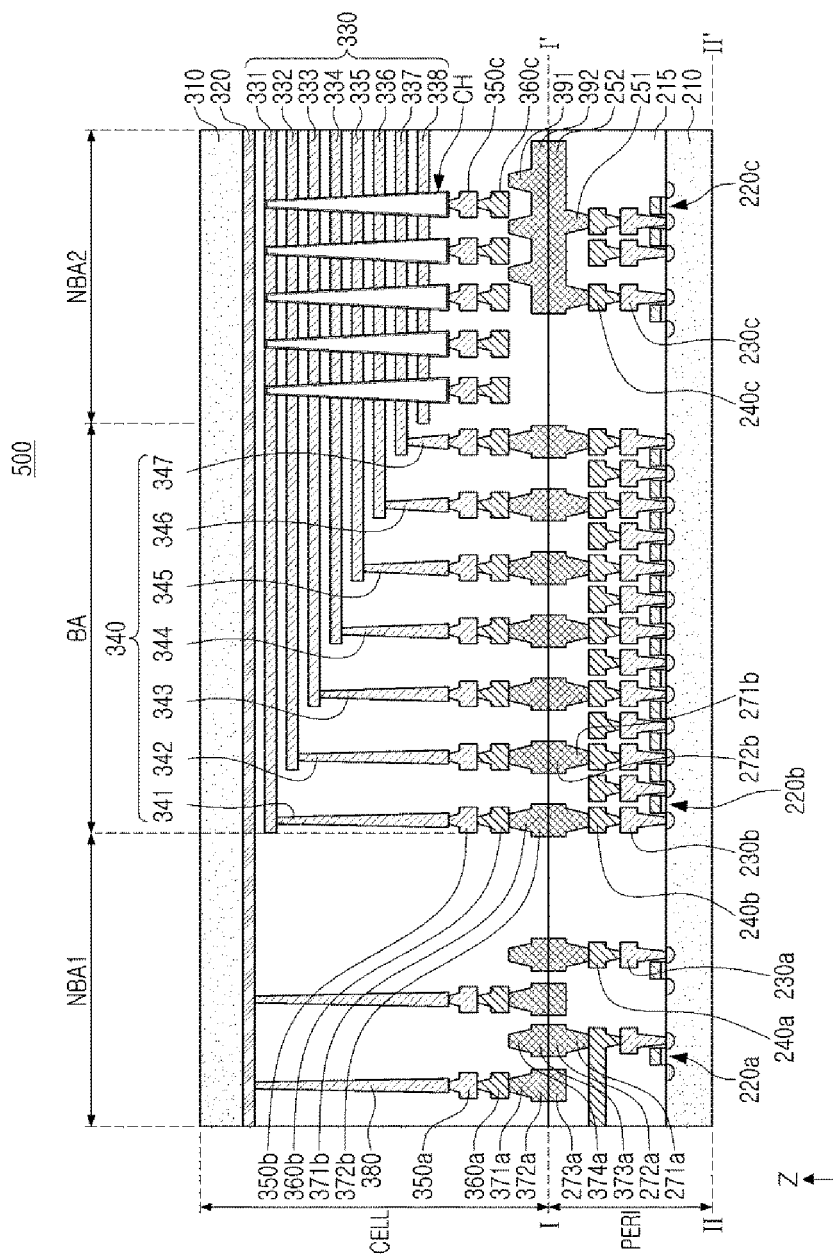

Referring to FIG. 8, a memory device 500 may further include a contact 374a on the upper metal pattern 373a formed in the uppermost metal layer of the cell region CELL in a first non-bonding area NBA1. The contact 374a formed on the upper metal pattern 373a may not be electrically connected to a second metal layer 360a of the first non-bonding area NBA1.

Similarly, in the second non-bonding area NBA2, a contact 391 may be further provided on an upper metal pattern 392 formed in the uppermost metal layer of the cell region CELL. The contact 391 formed on the upper metal pattern 392 may not be electrically connected to a second metal layer 360c.

Chemical mechanical polishing (CMP) may refer to a process of polishing and planarizing a wafer. Pressure may be applied to the wafer in the CMP process. If no material serving as a support, such as a contact or the like, is present below the metal pattern formed in the uppermost metal layer, a chip may be collapsed by the pressure applied in the CMP process. Therefore, chip failure may occur during the CMP process.

According to an example embodiment, the occurrence of a chip defect during a CMP process may be reduced by further forming a contact not connected to the second metal layer, on the reinforcing metal pattern formed in the uppermost metal layer in the non-bonding area.

Figure 9:
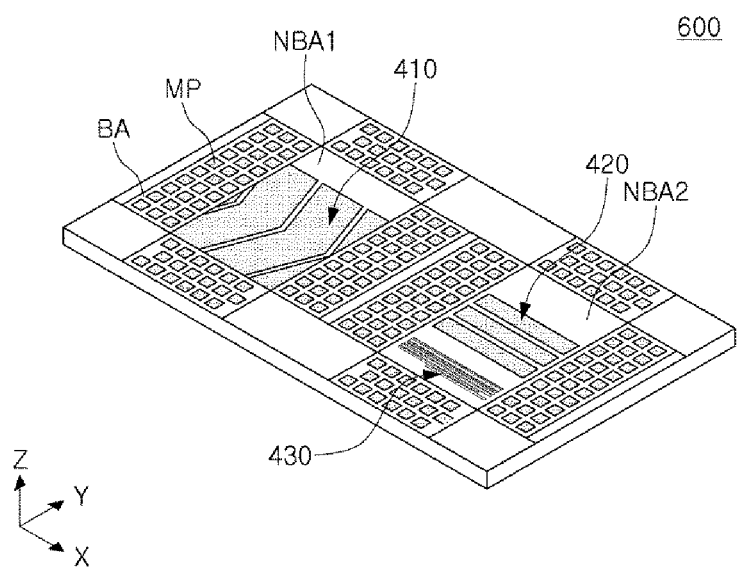
FIG. 9 is a schematic plan view illustrating a memory device according to an example embodiment.

FIG. 9 is a schematic plan view illustrating a memory device according to an example embodiment.

Referring to FIG. 9, a peripheral circuit region of a memory device 600 may include bonding areas BA, a first non-bonding area NBA1, and a second non-bonding area NBA2. As described with reference to FIG. 3, in the bonding area BA of the peripheral circuit region, a metal pattern MP for bonding may be formed in the uppermost metal layer of the bonding area BA of the peripheral circuit region to connect the peripheral circuit region and the cell region to each other.

In the first non-bonding area NBA1 of the peripheral circuit region, first routing wires 410 may be formed in the uppermost metal layer. For example, the first routing wires 410 may be used as a power line for supplying power to a common source line. Therefore, the chip size may be reduced.

Corresponding to the power line 410 formed in the uppermost metal layer of the peripheral circuit region, a reinforcing metal pattern having the same shape as the power line 410 formed in the uppermost metal layer of the peripheral circuit region may be formed in the uppermost metal layer of the cell region. Therefore, the resistance of the power line 410 for supplying power to the common source line may be reduced, thereby reducing power noise.

The reason why the power line 410 is formed in a zigzag pattern in FIG. 9 is that the density of the metal pattern of the power line 410 should satisfy 80% or less of the entire area of the first non-bonding area NBA1. In addition, in a case in which the power line 410 is formed in a line pattern instead of a zigzag pattern, any one bit line may overall pass below the power line 410, and another bit line may overall pass between metal patterns of the power line 410. Therefore, characteristics of a memory cell may vary for each memory cell included in the cell region.

In the second non-bonding area NBA2 of the peripheral circuit region, second routing wires 420 and third routing wires 430 may be formed in the uppermost metal layer. For example, the second routing wires 420 may be used as power lines for supplying a power supply voltage and a ground voltage of a logic region, and an external power supply voltage EVC. The third routing wires 430 may be used as signal wiring such as word lines, bit lines, and signal lines of a logic region. Therefore, the chip size may be reduced.

In addition, when the second routing wires 420 are used as power lines, power noise may be reduced and may be used for signal shielding. When the third routing wires 430 are utilized as signal lines, signal characteristics may be improved.

Figure 10:
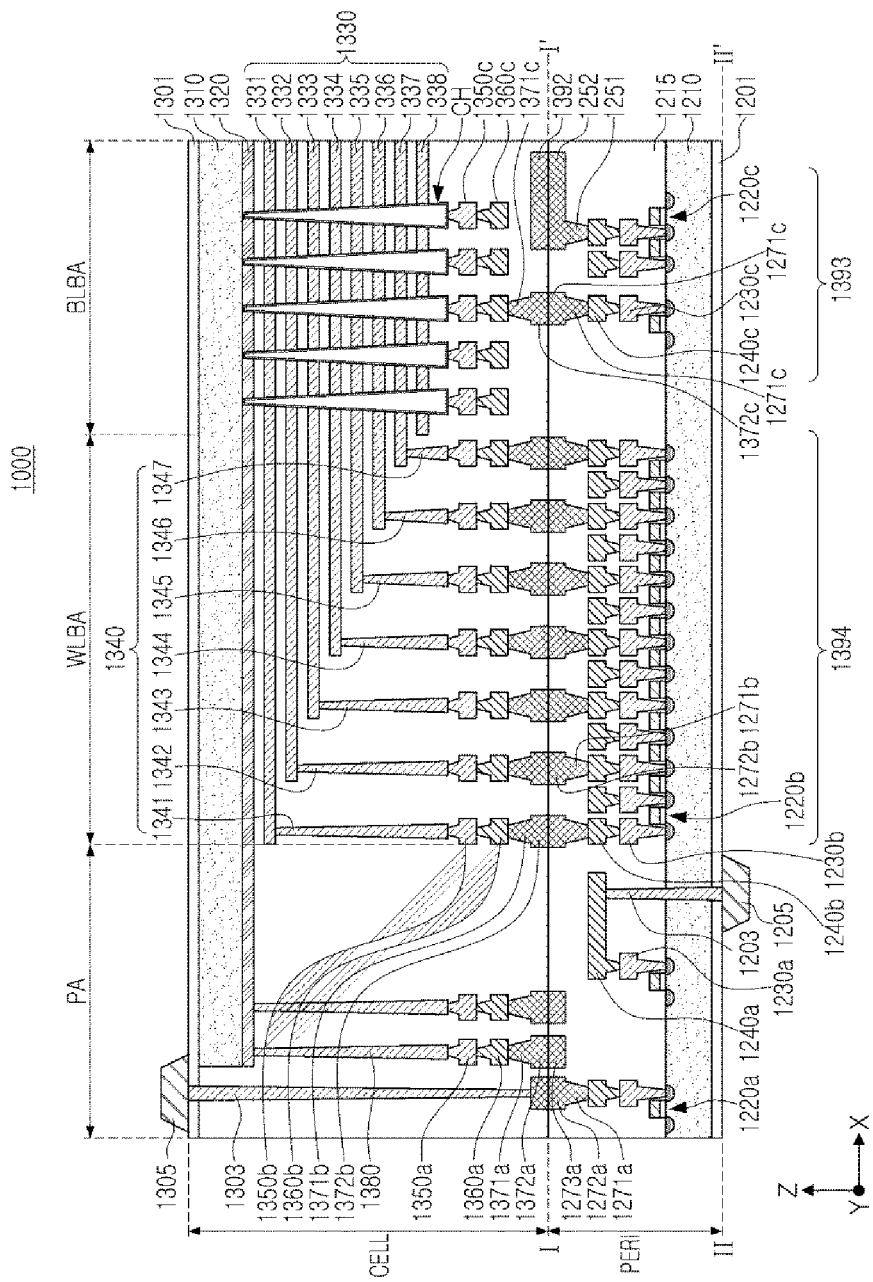
FIG. 10 a block diagram schematically illustrating a memory device implemented with C2C structure according to an example embodiment.

FIG. 10 is a diagram illustrating of a non-volatile memory device implemented with C2C structure according to an exemplary embodiment of the present inventive concept.

Referring to FIG. 10, a memory device 1000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 1000 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 1240a, 1240b, and 1240c formed on the first metal layers 1230a, 1230b, and 1230c. In an example embodiment, the first metal layers 1230a, 1230b, and 1230c may be formed of tungsten having relatively high resistivity, and the second metal layers 1240a, 1240b, and 1240c may be formed of copper having relatively low resistivity.

In an example embodiment illustrate in FIG. 10, although the first metal layers 1230a, 1230b, and 1230c and the second metal layers 1240a, 1240b, and 1240c are shown and described, they are not limited thereto, and one or more metal layers may be further formed on the second metal layers 1240a, 1240b, and 1240c. At least a portion of the one or more metal layers formed on the second metal layers 1240a, 1240b, and 1240c may be formed of aluminum or the like having a lower resistivity than those of copper forming the second metal layers 1240a, 1240b, and 1240c.

The interlayer insulating layer 1215 may be disposed on the first substrate 1210 and cover the plurality of circuit elements 1220a, 1220b, and 1220c, the first metal layers 1230a, 1230b, and 1230c, and the second metal layers 1240a, 1240b, and 1240c. The interlayer insulating layer 1215 may include an insulating material such as silicon oxide, silicon nitride, or the like.

Lower bonding metals 1271b and 1272b may be formed on the second metal layer 1240b in the word line bonding area WLBA. In the word line bonding area WLBA, the lower bonding metals 1271b and 1272b in the peripheral circuit region PERI may be electrically connected to upper bonding metals 1371b and 1372b in the cell region CELL in a bonding manner, and the lower bonding metals 1271b and 1272b and the upper bonding metals 1371b and 1372b may be formed of aluminum, copper, tungsten, or the like.

The cell region CELL may include at least one memory block. The cell region CELL may include a second substrate 1310 and a common source line 1320. On the second substrate 1310, a plurality of word lines 1331 to 1338 (i.e., 1330) may be stacked in a direction (a Z-axis direction), perpendicular to an upper surface of the second substrate 1310. At least one string select line and at least one ground select line may be arranged on and below the plurality of word lines 1330, respectively, and the plurality of word lines 1330 may be disposed between the at least one string select line and the at least one ground select line.

In the bit line bonding area BLBA, a channel structure CH may extend in a direction, perpendicular to the upper surface of the second substrate 1310, and pass through the plurality of word lines 1330, the at least one string select line, and the at least one ground select line. The channel structure CH may include a data storage layer, a channel layer, a buried insulating layer, and the like, and the channel layer may be electrically connected to a first metal layer 1350c and a second metal layer 1360c. For example, the first metal layer 1350c may be a bit line contact, and the second metal layer 1360c may be a bit line. In an example embodiment, the bit line 1360c may extend in a first direction (a Y-axis direction), parallel to the upper surface of the second substrate 1310.

In an example embodiment illustrated in FIG. 10, an area in which the channel structure CH, the bit line 1360c, and the like are disposed may be defined as the bit line bonding area BLBA. In the bit line bonding area BLBA, the bit line 1360c may be electrically connected to the circuit elements 1220c providing a page buffer 1393 in the peripheral circuit region PERI. For example, the bit line 1360c may be connected to upper bonding metals 1371c and 1372c in the cell region CELL, and the upper bonding metals 1371c and 1372c may be connected to lower bonding metals 1271c and 1272c connected to the circuit elements 1220c of the page buffer 1393.

In the word line bonding area WLBA, the plurality of word lines 1330 may extend in a second direction (an X-axis direction), parallel to the upper surface of the second substrate 1310, and may be connected to a plurality of cell contact plugs 1341 to 1347 (i.e., 1340). The plurality of word lines 1330 and the plurality of cell contact plugs 1340 may be connected to each other in pads provided by at least a portion of the plurality of word lines 1330 extending in different lengths in the second direction. A first metal layer 1350b and a second metal layer 1360b may be connected to an upper portion of the plurality of cell contact plugs 1340 connected to the plurality of word lines 1330, sequentially. The plurality of cell contact plugs 1340 may be connected to the circuit region PERI by the upper bonding metals 1371*b* and 1372*b* of the cell region CELL and the lower bonding metals 1271*b* and 1272*b* of the peripheral circuit region PERI in the word line bonding area WLBA.

The plurality of cell contact plugs 1340 may be electrically connected to the circuit elements 1220*b* providing a row decoder 1394 in the peripheral circuit region PERI. In an example embodiment, operating voltages of the circuit elements 1220*b* providing the row decoder 1394 may be different than operating voltages of the circuit elements 1220*c* providing the page buffer 1393. For example, operating voltages of the circuit elements 1220*c* providing the page buffer 1393 may be greater than operating voltages of the circuit elements 1220*b* providing the row decoder 1394.

A common source line contact plug 1380 may be disposed in the external pad bonding area PA. The common source line contact plug 1380 may be formed of a conductive material such as a metal, a metal compound, poly silicon, or the like, and may be electrically connected to the common source line 1320. A first metal layer 1350*a* and a second metal layer 1360*a* may be stacked on an upper portion of the common source line contact plug 1380, sequentially. For example, an area in which the common source line contact plug 1380, the first metal layer 1350*a*, and the second metal layer 1360*a* are disposed may be defined as the external pad bonding area PA.

Input-output pads 1205 and 1305 may be disposed in the external pad bonding area PA. Referring to FIG. 10, a lower insulating film 1201 covering a lower surface of the first substrate 1210 may be formed below the first substrate 1210, and a first input-output pad 1205 may be formed on the lower insulating film 1201. The first input-output pad 1205 may be connected to at least one of the plurality of circuit elements 1220*a*, 1220*b*, and 1220*c* disposed in the peripheral circuit region PERI through a first input-output contact plug 1203, and may be separated from the first substrate 1210 by the lower insulating film 1201. In addition, a side insulating film may be disposed between the first input-output contact plug 1203 and the first substrate 1210 to electrically separate the first input-output contact plug 1203 and the first substrate 1210.

Referring to FIG. 10, an upper insulating film 1301 covering the upper surface of the second substrate 1310 may be formed on the second substrate 1310, and a second input-output pad 1305 may be disposed on the upper insulating layer 1301. The second input-output pad 1305 may be connected to at least one of the plurality of circuit elements 1220*a*, 1220*b*, and 1220*c* disposed in the peripheral circuit region PERI through a second input-output contact plug 1303.

According to embodiments, the second substrate 1310 and the common source line 1320 may not be disposed in an area in which the second input-output contact plug 1303 is disposed. Also, the second input-output pad 1305 may not overlap the word lines 1330 in the third direction (the Z-axis direction). Referring to FIG. 10, the second input-output contact plug 1303 may be separated from the second substrate 1310 in a direction, parallel to the upper surface of the second substrate 1310, and may pass through the interlayer insulating layer 1315 of the cell region CELL to be connected to the second input-output pad 1305.

According to embodiments, the first input-output pad 1205 and the second input-output pad 1305 may be selectively formed. For example, the memory device 1000 may include only the first input-output pad 1205 disposed on the first substrate 1210 or the second input-output pad 1305 disposed on the second substrate 1310. Alternatively, the memory device 1000 may include both the first input-output pad 1205 and the second input-output pad 1305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1000 may include a lower metal pattern 1273*a*, corresponding to an upper metal pattern 1372*a* formed in an uppermost metal layer of the cell region CELL, and having the same shape as the upper metal pattern 1372*a* of the cell region CELL, in an uppermost metal layer of the peripheral circuit region PERI. In the peripheral circuit region PERI, the lower metal pattern 1273*a* formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 1271*b* and 1272*b* may be formed on the second metal layer 1240*b* in the word line bonding area WLBA. In the word line bonding area WLBA, the lower bonding metals 1271*b* and 1272*b* of the peripheral circuit region PERI may be electrically connected to the upper bonding metals 1371*b* and 1372*b* of the cell region CELL by a Cu—Cu bonding.

Further, the bit line bonding area BLBA, an upper metal pattern 1392, corresponding to a lower metal pattern 1252 formed in the uppermost metal layer of the peripheral circuit region PERI, and having the same shape as the lower metal pattern 1252 of the peripheral circuit region PERI, may be formed in an uppermost metal layer of the cell region CELL. A contact may not be formed on the upper metal pattern 1392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

Figure 11:
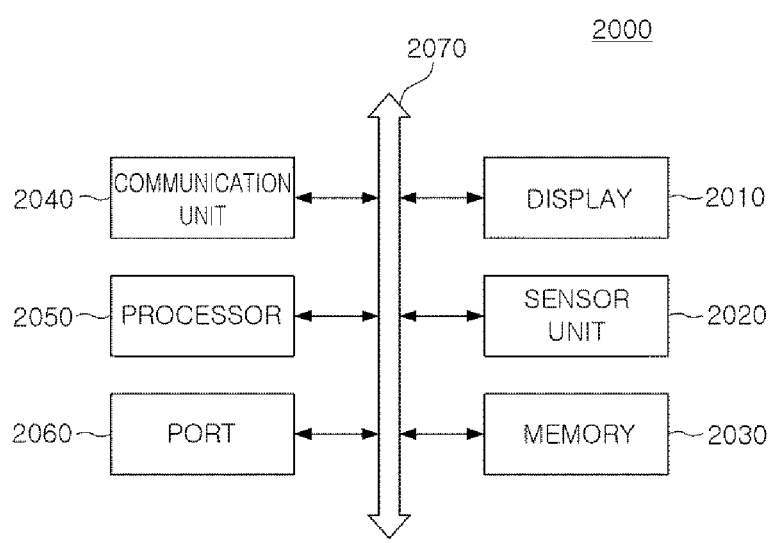
FIG. 11 is a block diagram schematically illustrating an electronic device including a memory device according to an example embodiment.

FIG. 11 is a block diagram schematically illustrating an electronic device including a memory device according to an example embodiment.

An electronic device 2000 according to an example embodiment illustrated in FIG. 11 includes a display 2010, a sensor unit 2020, a memory 2030, a communication unit 2040, a processor 2050, a port 2060, and the like. The electronic device 2000 may further include a power supply device, an input/output device and the like. Among the components illustrated in FIG. 11, the port 2060 may be a device provided for the electronic device 2000 to communicate with a video card, a sound card, a memory card, a USB device, and the like. The electronic device 2000 may include not only a general desktop computer or a laptop computer but also a smartphone, a tablet PC, a smart wearable device, and the like.

The processor 2050 may perform a specific operation, an instruction, a task, and the like. The processor 2050 may be a central processing unit (CPU) or a microprocessor unit (MCU), a system on chip (SoC), or the like, and may communicate with other devices connected to the port 2060 as well as with the display 2010, the sensor unit 2020, the memory 2030 and the communication unit 2040, via a bus.

The memory 2030 may be a storage medium that stores data required for the operation of the electronic device 2000, multimedia data or the like. The memory 2030 may include a volatile memory, such as a random access memory (RAM), or a nonvolatile memory, such as a flash memory or the like. The memory 2030 may also include at least one of a solid state drive (SSD), a hard disk drive (HDD), and an optical drive (ODD), as a storage device. In an example embodiment illustrated in FIG. 11, the memory 2030 may include a memory device according to various embodiments described above with reference to FIGS. 1 to 10.

As set forth above, according to various example embodiments, routing wires may be formed in an uppermost metal layer of a non-bonding area in which a cell region and a peripheral circuit region are not electrically connected. Therefore, since there is no need to secure a separate space for a routing wire, the chip size may be reduced.

While example embodiments have been shown and described above, it will be apparent to those skilled in the art that modifications and variations could be made without departing from the scope of the present inventive concept as defined by the appended claims.

What is claimed is:

1. A memory device comprising:
a memory cell chip including a memory cell array disposed on a first substrate, and a first metal pad on a first uppermost metal layer of a memory cell region; and
a peripheral circuit chip including circuit devices disposed on a second substrate, and a second metal pad on a second uppermost metal layer of the peripheral circuit chip, the circuit devices providing a peripheral circuit operating the memory cell array,
wherein the memory cell chip and the peripheral circuit chip are vertically connected to each other by the first metal pad and the second metal pad in a bonding area, and
a routing wire electrically connected to the peripheral circuit is disposed in at least one of the first uppermost metal layer or the second uppermost metal layer and is disposed in a non-bonding area in which the memory cell chip and the peripheral circuit chip are not electrically connected to each other, the routing wire being used for supplying power to the peripheral circuit of the peripheral circuit chip.

2. The memory device of claim 1, wherein the peripheral circuit chip comprises a first metal layer disposed on the second substrate, and a second metal layer disposed on the first metal layer, and the routing wire is disposed on the second uppermost metal layer in the non-bonding area and is electrically connected to the second metal layer.

3. The memory device of claim 1, wherein the memory cell chip comprises a first metal layer disposed on the first substrate, and a second metal layer disposed on the first metal layer, and the routing wire is disposed in the first uppermost metal layer and is electrically connected to the second metal layer in the non-bonding area.

4. The memory device of claim 1, wherein the routing wire comprises a first routing wire disposed on the first uppermost metal layer and a second routing wire disposed on the second uppermost metal layer, the first routing wire comprises a first contact and a first metal pattern, the second routing wire comprises a second contact and a second metal pattern, and the first metal pattern and the second metal pattern are not electrically connected to each other.

5. The memory device of claim 4, wherein the peripheral circuit chip comprises a first metal layer disposed on the second substrate, and a second metal layer disposed on the first metal layer, and the second metal pattern is disposed on the second uppermost metal layer and is electrically connected to the second metal layer by the second contact in the non-bonding area.

6. The memory device of claim 4, wherein the memory cell chip comprises a first metal layer disposed on the first substrate, and a second metal layer disposed on the first metal layer, and the first metal pattern is disposed on the first uppermost metal layer and is electrically connected to the second metal layer by the first contact in the non-bonding area.

7. The memory device of claim 4, wherein, in a position corresponding to a position of the first metal pattern disposed on the first uppermost metal layer, a third metal pattern having a same shape as a shape of the first metal pattern is disposed on the second uppermost metal layer.

8. The memory device of claim 1, wherein at least one of the first uppermost metal layer or the second uppermost metal layer includes dummy pattern in the non-bonding area.

9. The memory device of claim 1, wherein the first metal pad and the second metal pad are formed of copper.

10. The memory device of claim 1, wherein a contact plug corresponding to the first metal pad and a contact plug corresponding to the second metal pad are formed to extend in opposite directions to each other.

11. A memory device comprising:
a memory cell chip including a first bonding area and a first non-bonding area disposed around the first bonding area; and
a peripheral circuit chip including a second bonding area disposed in a position corresponding to a position of the first bonding area, and a second non-bonding area disposed in a position corresponding to a position of the first non-bonding area and disposed around the second bonding area,
wherein a first metal pad disposed on an uppermost metal layer of the first bonding area and a second metal pad disposed on an uppermost metal layer of the second bonding area are electrically connected to each other,
wherein a third metal pad disposed in an uppermost metal layer of the first non-bonding area and a forth metal pad disposed on an uppermost metal layer of the second non-bonding area are not electrically connected to each other,
wherein the third metal pad or the fourth metal pad forms a routing wire that is a power line for supplying power to a peripheral circuit of the peripheral circuit chip.

12. The memory device of claim 11, wherein the first bonding area surrounds at least a portion of the first non-bonding area, and the second bonding area surrounds at least a portion of the second non-bonding area.

13. The memory device of claim 12, wherein the routing wire forms a zigzag pattern.

14. The memory device of claim 12, wherein the routing wire forms a line pattern.

15. The memory device of claim 11, wherein the memory cell chip further comprises a third bonding area and a third non-bonding area disposed around the third bonding area, the peripheral circuit chip further comprises a fourth bonding area and a fourth non-bonding area disposed around the fourth bonding area, at least one of the first bonding area and the third bonding area is provided between the first non-bonding area and the third non-bonding area, and at least one of the second bonding area and the fourth bonding area is provided between the second non-bonding area and the fourth non-bonding area.

16. A memory device comprising:
a memory cell chip including a first metal pad of a first bonding area and a third metal pad of a first non-bonding area; and
a peripheral circuit chip including a second metal pad of a second bonding area and vertically connected to the memory cell chip by the first metal pad and the second metal pad and a fourth metal pad of a second non-bonding area,
wherein the third metal pad is used as a first routing wire of the memory cell chip, the fourth metal pad is used as a second routing wire of the peripheral circuit chip,
wherein the second routing wire is a power line for supplying power to a peripheral circuit of the peripheral circuit chip.

17. The memory device of claim 16, wherein the first routing wire is a signal line or a power line.

18. The memory device of claim 16, wherein each of the first routing wire and the second routing wire is formed of copper.

19. The memory device of claim 16, wherein a contact plug corresponding to the third metal pad and a contact plug corresponding to the fourth metal pad are formed to extend in opposite directions to each other.

20. The memory device of claim 16, wherein at least one of a contact corresponding to the third metal pad and a contact corresponding to the fourth metal pad is not formed.

* * * * *